United States Patent
Tsai et al.

(10) Patent No.: US 8,653,901 B2
(45) Date of Patent: Feb. 18, 2014

(54) OSCILLATOR AND CONTROL CIRCUIT THEREOF

(75) Inventors: Jia-Shian Tsai, Zhubei (TW); Kuo-Tai Chang, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 32 days.

(21) Appl. No.: 13/428,774

(22) Filed: Mar. 23, 2012

(65) Prior Publication Data

US 2012/0242419 A1 Sep. 27, 2012

(30) Foreign Application Priority Data

Mar. 24, 2011 (TW) .............................. 100110198 A

(51) Int. Cl.
  *H03B 5/32* (2006.01)
(52) U.S. Cl.
  USPC .......................................... 331/160; 331/161
(58) Field of Classification Search
  USPC .................................. 331/160, 161
  See application file for complete search history.

(56) References Cited

U.S. PATENT DOCUMENTS

| | | | |
|---|---|---|---|
| 3,617,622 A * | 11/1971 | Harwood | ...................... 348/507 |
| 5,208,558 A * | 5/1993 | Shigehara et al. | ...... 331/116 FE |
| 6,798,301 B1 | 9/2004 | Balan et al. | |
| 7,123,113 B1 | 10/2006 | Brennan et al. | |
| 7,187,245 B1 * | 3/2007 | McMenamy | .................. 331/158 |

FOREIGN PATENT DOCUMENTS

TW I314816 B 9/2009

* cited by examiner

*Primary Examiner* — Joseph Chang
(74) *Attorney, Agent, or Firm* — Rabin & Berdo, P.C.

(57) ABSTRACT

An oscillator and a control circuit thereof are provided. The control circuit is configured to control an oscillator to adjust the amplitude and the level of an oscillation signal. The control circuit includes a peak amplitude detector, an average voltage detector, and an oscillation controller. The peak amplitude detector is configured to detect the amplitude of the oscillation signal, so as to generate an amplitude value. The average voltage detector is configured to detect the direct current (DC) level of the oscillation signal, so as to generate an average value. The oscillation controller is configured to generate two power signals according to the amplitude value and the average value. The two power signals are provided to the oscillator, so that the oscillator adjusts the amplitude and DC level of the oscillation signal.

12 Claims, 4 Drawing Sheets

US 8,653,901 B2

OSCILLATOR AND CONTROL CIRCUIT THEREOF

This application claims the benefit of Taiwan application Serial No. 100110198, filed Mar. 24, 2011, the subject matter of which is incorporated herein by reference.

BACKGROUND OF THE INVENTION

1. Field of the Invention

The invention relates in general to an oscillator and a control circuit, and more particularly to a crystal oscillator and a control circuit thereof.

2. Description of the Related Art

Oscillators have been widely used in various applications for providing a system with accurate and stable frequency standard, such as clock signals. In short, an oscillator is served as a frequency source, or as an electronic device which itself can convert direct current (DC) power into alternative current (AC) power without external excited signals. In the course of oscillating, the oscillator usually uses a feedback amplifier to generate an oscillation signal. Thus, the performance of an oscillator is based on whether there is an accurate, stable oscillation signal.

In general, the frequency of the oscillation signal is the primary concern for the oscillator. However, the swing of the oscillation signal also affects the performance of the oscillation. For example, an oscillator can be implemented by using feedback resistors and inverse inverters, the performance of which, however, is required to be improved. In such oscillators, the swing of the oscillation signal may become too large or too small to be properly controlled. Moreover, different oscillators have different circuits, so that the generated oscillation signals are different from each other.

In addition to the difficulty in controlling inverse amplifiers, how to adjust current consumed by the oscillator also is required to be taken into consideration. In light of power saving, the oscillator is tuned to be operated at low power. At this time, in an environment where noise level is high, the oscillator may have problem generating an oscillation signal. Therefore, it is a subject of the industrial endeavors to provide an oscillator which has high performance of generating an accurate, stable oscillation signal.

SUMMARY OF THE INVENTION

The invention is directed to an oscillator and a control circuit, wherein the oscillator has enhanced noise immunity and high performance of generating an accurate, stable oscillation signal.

According to an aspect of the present invention, an oscillator is provided for adjusting the amplitude and the level of an oscillation signal. The oscillator comprises two terminals, a crystal, a feedback resistor, an amplifier, a peak amplitude detector, an average voltage detector, and an oscillation controller. Each of two terminals is used to be coupled to a capacitor. The crystal is coupled between the two terminals. The feedback resistor is coupled between the two terminals. The amplifier is coupled between the two terminals. The peak amplitude detector is coupled to one of the two terminals. The peak amplitude detector detects the amplitude of the oscillation signal and generates an amplitude value. The average voltage detector is coupled to one of the two terminals. The average voltage detector detects the level of the oscillation signal and generates an average value. The oscillation controller is configured to generate two power signals according to the amplitude value and the average value. The two power signals are provided to the amplifier so that the amplifier adjusts the amplitude and DC level of the oscillation signal.

According to another aspect of the present invention, a control circuit is provided. The control circuit is for use in an oscillator. The control circuit is for adjusting the amplitude and the level of an oscillation signal generated by the oscillator. The control circuit comprises a peak amplitude detector, an average voltage detector, and an oscillation controller. The peak amplitude detector detects the amplitude of the oscillation signal and generates an amplitude value. The average voltage detector detects the DC level of the oscillation signal and generates an average value. The oscillation controller generates two power signals according to the amplitude value and the average value. The two power signals are provided to the oscillator so that the oscillator adjusts the amplitude and DC level of the oscillation signal.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
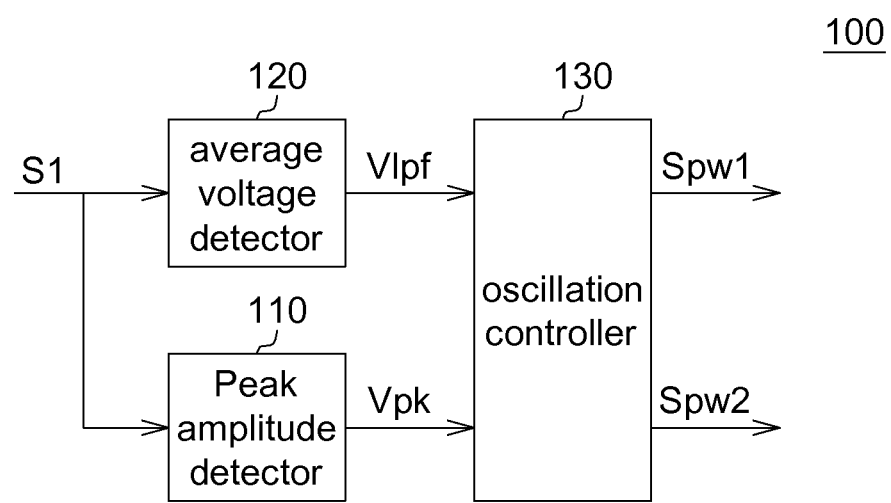
FIG. 1 is a block diagram showing a control circuit according to an embodiment of the invention.

FIG. 1 is a block diagram showing a control circuit according to an embodiment of the invention. The control circuit 100 is for use in an oscillator which is not shown in FIG. 1. The control circuit 100 is for adjusting the amplitude and the level of an oscillation signal S1 provided by the oscillator. The control circuit 100 includes a peak amplitude detector 110, an average voltage detector 120, and an oscillation controller 130. The peak amplitude detector 110 detects the amplitude of the oscillation signal S1 and generates an amplitude value Vpk. The average voltage detector 120 detects the direct current (DC) level of the oscillation signal S1 and generates an average value Vlpf. The oscillation controller 130 generates two power signals Spw1 and Spw2 according to the amplitude value Vpk and the average value Vlpf. The two power signals Spw1 and Spw2 are provided to the oscillator so that the oscillator adjusts the amplitude and the DC level of the oscillation signal S1. In this way, the oscillation signal S1 can be oscillated such that its amplitude and DC level is under stable feedback control and within proper region. Therefore, the oscillator has enhanced noise immunity and high performance of generating an accurate, stable oscillation signal.

Figure 2:
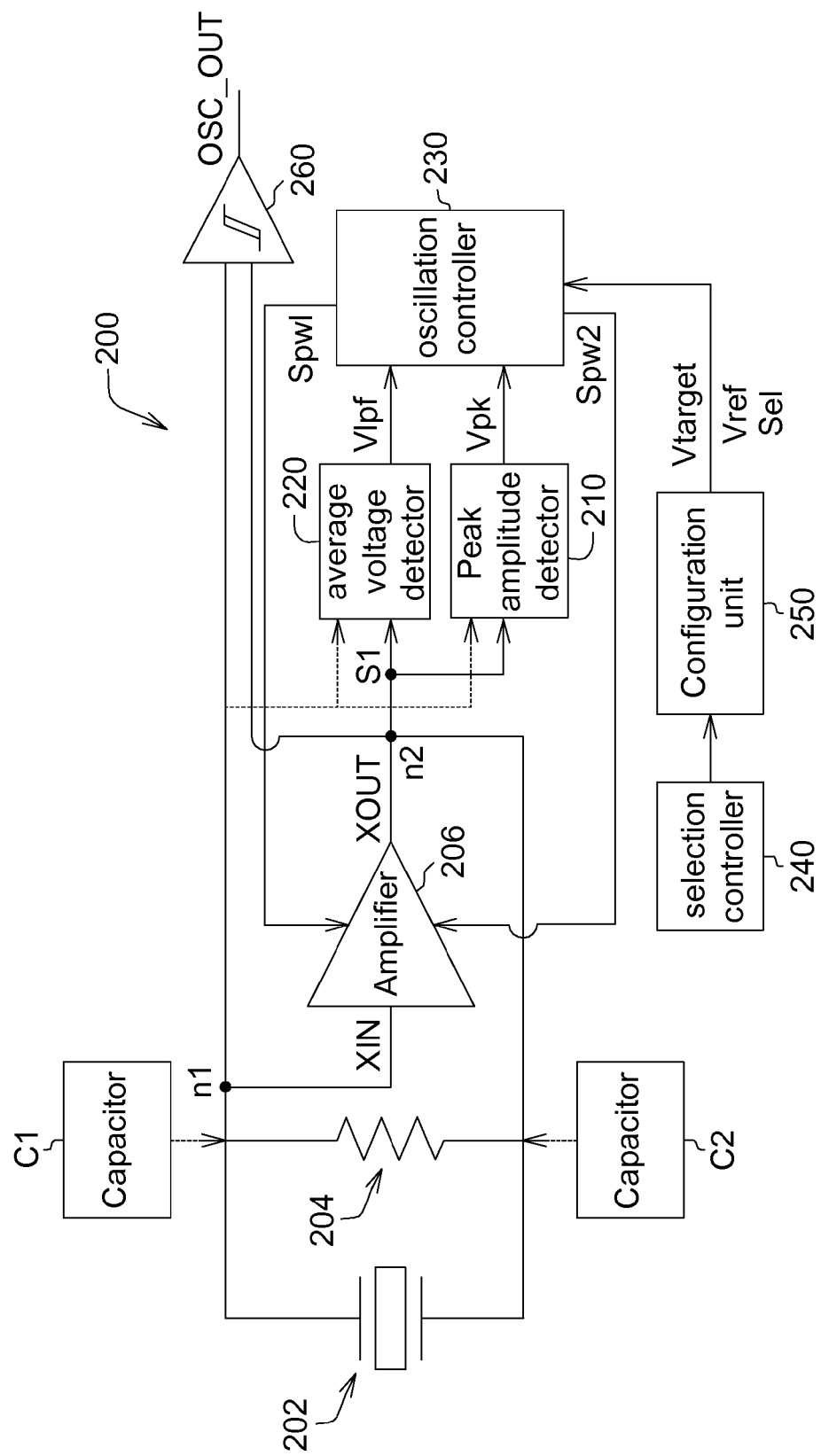
FIG. 2 is a block diagram showing an oscillator according to an embodiment of the invention.

FIG. 2 is a block diagram showing an oscillator according to an embodiment of the invention. The oscillator 200 includes two terminals n1 and n2, a crystal 202, a feedback resistor 204, an amplifier 206, a peak amplitude detector 210, an average voltage detector 220, and an oscillation controller 230. Among these elements, the crystal 202, the feedback resistor 204, and the amplifier 206 form an oscillation circuit which generates an oscillation signal S1 of the oscillator 200.

On the other hand, the peak amplitude detector 210, the average voltage detector 220, and the oscillation controller 230 are exemplified as having similar circuit architectures with those of the control circuit 100 in FIG. 1.

Each of two terminals n1 and n2 is used to be coupled to a capacitor, such as a capacitor C1 or a capacitor C2. The capacitors can include build-in capacitors or external capacitors of an integrated chip in which the oscillator 200 is implemented. In FIG. 2, the capacitors are exemplified as external capacitors and shown by dashed lines. Each capacitor can be a single capacitive element, or multiple capacitive elements which are combined to determine the resonance frequency of the oscillator 200. The crystal 202 is coupled between the two terminals n1 and n2. The crystal 202 is for example a quartz crystal resonator. The feedback resistor 204 is coupled between the two terminals n1 and n2. The amplifier 206 is coupled between the two terminals n1 and n2. The amplifier 206 receives two power signals Spw1 and Spw2 which determine the oscillation width or swing of the oscillation signal S1.

The crystal 202, the feedback resistor 204, and the amplifier 206 form a feedback oscillation circuit where the amplifier 206 has its output input to the crystal 202. As such, the peak amplitude detector 210 and the average voltage detector 220 can be coupled to, for example, one of the terminals n1 and n2 of the oscillator 200, or to where the variation of the oscillation signal S1 can be detected. As shown in FIG. 2, the peak amplitude detector 210 and the average voltage detector 220 are coupled to the terminal n1. In other embodiments, the peak amplitude detector 210 and the average voltage detector 220 are coupled to the terminal n2, which is denoted by dashed arrows. In other words, the oscillation signal S1 can be an input signal XIN or an output signal XOUT of the amplifier 206.

The peak amplitude detector 210 detects the amplitude of the oscillation signal S1 and generates an amplitude value Vpk. The amplitude value Vpk indicates the amplitude or the maximum swing of the oscillation signal S1. The amplitude value Vpk is input to the oscillation controller 230 for feedback control. For example, when the amplitude value Vpk indicates a small signal swing, the oscillation controller 230 controls the amplifier 206 to increase its gain and expand the signal swing.

The average voltage detector 220 is for detecting the DC level of the oscillation signal S1 and generating an average value Vlpf. The average voltage detector 220 is for example implemented by a low-pass filter. The combination of the average value Vlpf and the amplitude value Vpk can be used to determine whether the positive and negative swings of the oscillation signal S1 are within an expected region. For example, the swing of the oscillation signal S1 can be large enough to withstand interference, or small enough to avoid signal distortion and harmonics. In some embodiments, the average value Vlpf can be configured as the average or average value of operation voltages, or as other reference value therebetween. In this way, the positive and negative swings of the oscillation signal S1 can be provided with sufficient or enough spaces for oscillating, thus stabilizing the completion of the signal swing.

The oscillation controller 230 is configured to generate two power signals Spw1 and Spw2 according to the amplitude value Vpk and the average value Vlpf. The two power signals Spw1 and Spw2 are provided to the amplifier 206 so that the amplifier 206 adjusts the amplitude and DC level of the oscillation signal S1. In some embodiments, the power signals Spw1 and Spw2 are, for example but non-limitedly, two current signals. The operation of the oscillation controller is exemplarily elaborated below with reference to FIG. 3.

Figure 3:
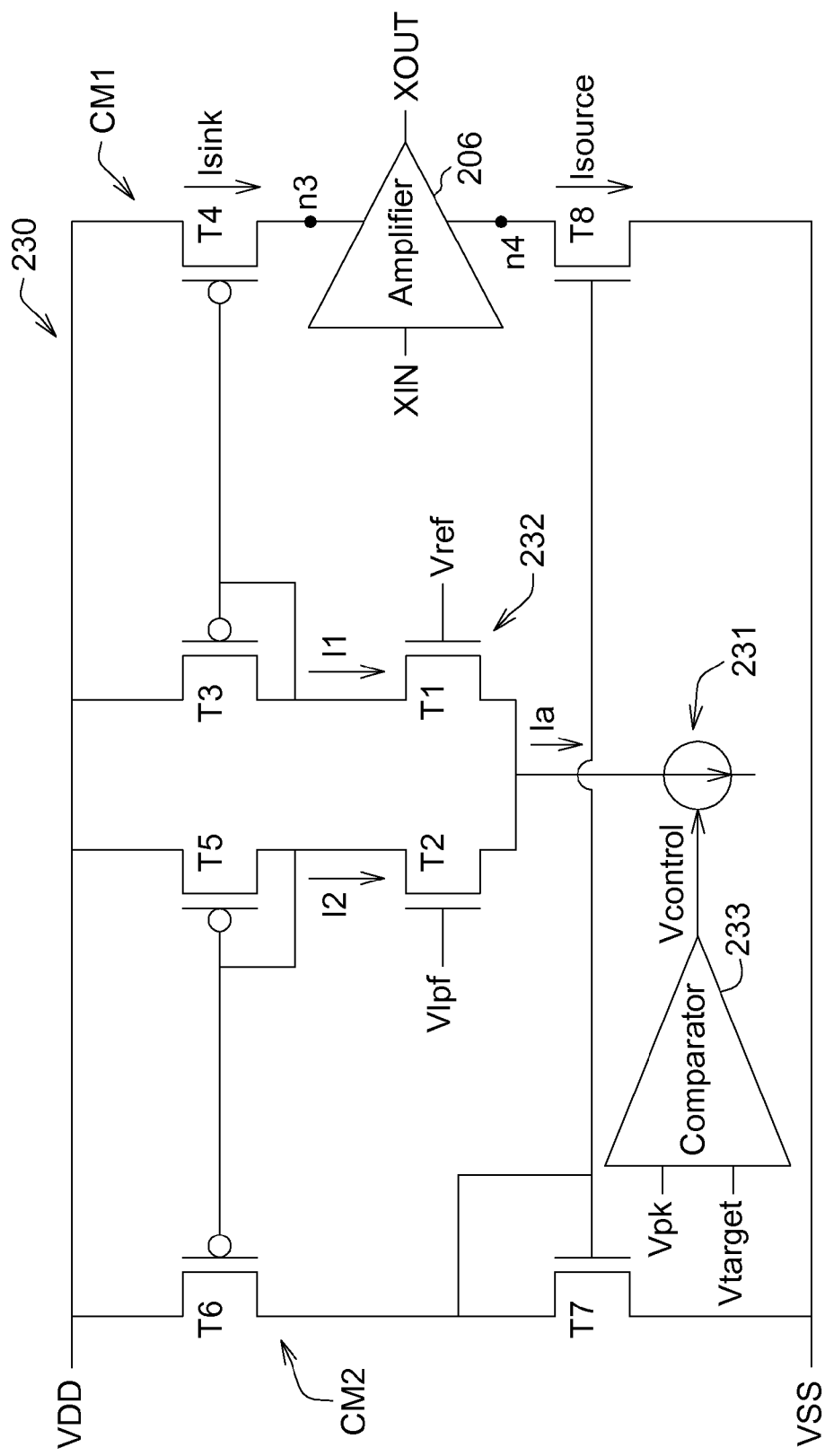
FIG. 3 is a schematic diagram showing an example of the oscillation controller of FIG. 2.

FIG. 3 is a schematic diagram showing an example of the oscillation controller of FIG. 2. In this example, the oscillation controller 230 includes two power supply terminals n3 and n4, a variable current source, comparators 232 and 233. The oscillation controller 230 is biased between two voltages VDD and VSS. The power supply terminals n3 and n4 are coupled to the amplifier 206. The variable current source 231 is for providing a bias current Ia. The amplitude of the bias current Ia is varied with the amplitude value Vpk of the oscillation signal S1. In this example, the amplitude of the biasing current Ia is controlled by the comparator 233. The comparator 233 is coupled to the variable current source 231. The comparator 233 compares the amplitude value Vpk with a target value Vtarget. The comparator 233 bases its comparison result on generating a control signal Vcontrol which is used to control the amplitude of the bias current Ia provided by the variable current source 231. In other words, the variable current source 231 can be implemented as a voltage to current converter. In this implementation, before the amplitude value Vpk of the oscillation signal S1 reaches the target value Vtarget, the biasing current Ia having a high amplitude will be fed into the amplifier 206, so as to increase its gain. When the amplitude value Vpk of the oscillation signal S1 is increased gradually, the biasing current Ia will be lowered gradually.

Figure 4:
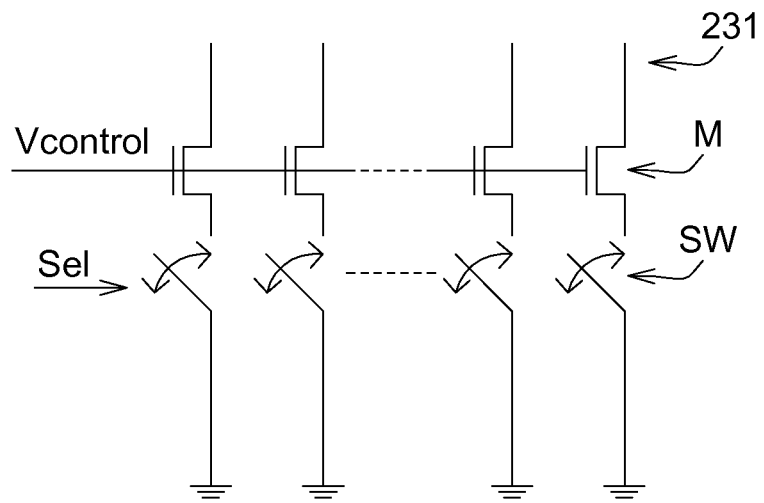
FIG. 4 is a schematic diagram showing an embodiment of the variable current source of FIG. 3.

Embodiments of the variable current source 231 are provided below for further illustration with reference to FIG. 4. FIG. 4 is a schematic diagram showing an embodiment of the variable current source of FIG. 3. The variable current source 231 includes a number of metal-oxide-semiconductor field effect transistors M and a number of switches SW. The combination of one transistor and one switch provides a portion of the biasing current Ia. The control terminals of the transistors M are controlled by the control signal Vcontrol. When the control signal Vcontrol has a high level, a higher current flows through the transistors M. Besides, how many switches SW are turned on is controlled by a selection signal Sel, which also determines the amplitude of the biasing current Ia. Thus, the oscillator 200 has increased operational flexibility.

Refer to FIG. 3 for further illustration. The comparator 232 couples the variable current source 231 to the two power supply terminals n3 and n4. The comparator 232 compares the average value Vlpf with a reference value Vref. In the example of FIG. 3, the comparator 232 includes current mirrors CM1 and CM2, and transistors T1 and T2. The current mirror CM1 is coupled to the power supply terminal n3. The current mirror CM2 is coupled to the power supply terminal n4. The current mirror CM2 is for example implemented by transistors T5, T6, T7, and T8. The transistor T1 has a data terminal coupled to the current mirror CM1, another data terminal coupled to the variable current source 231, and a control terminal for receiving the reference value Vref. The transistor T2 has a data terminal coupled to the current mirror CM2, another data terminal coupled to the variable current source 231 and the another data terminal of the transistor T1, and a control terminal for receiving the average value Vlpf.

When the bias current Ia flows into the comparator 232, a source current (source and a sink current Isink which are related to the comparison result of the comparator 232 are formed. For example, as regards the operational characteristic of the transistors T1 and T2 of FIG. 3, when the average value Vlpf is lower than the reference value Vref, the transistor T1 draws from the biasing current Ia higher current than does the transistor T2, i.e., current I1 is higher current I2. After flowing through the current mirrors CM1 and CM2, the relationship between the currents I1 and I2 is reflected in the amplitudes of the source current (source and the sink current Isink. That is, the sink current Isink is higher than the source current Isource, which complies with the comparison result. The source current (source and the sink current Isink then flow into the two power supply terminals n3 and n4, and are supplied to the amplifier 206. Because a high sink current Isink makes the amplifier 206 increase the DC level of the oscillation signal S1, the detected average value Vlpf is increased correspondingly. As such, the reference value Vref and the average value Vlpf will have a reduced difference and gradually become equivalent to each other. On the other hand, when the average value Vlpf is higher than the reference value Vref, the current I1 is lower the current I2. At this time, the amplifier 206 decreases the DC level of the oscillation signal S1, resulting in a lower average value Vlpf. Thus, the average value Vlpf will be limited to the reference value Vref.

According to the aforementioned description, it can be seen that in an environment where noise level is high, the oscillator provided by the embodiments can improve on the problem of failing to generate an oscillation signal. For example, where there is noise interference during signal oscillation, the swing of the oscillation signal may be gradually reduced, or may be outside of the oscillating operation range, thus failing to generate an oscillation signal or causing signal distortion. In the embodiments, an oscillator is provided by using a peak amplitude detector and an average voltage detector to control the power of the amplifier, so as to adjust the gain or the oscillating operation range of the amplifier and improve the oscillating of the oscillation signal. Thus, the oscillator can have high performance of generating an accurate, stable oscillation signal.

Figure 5:
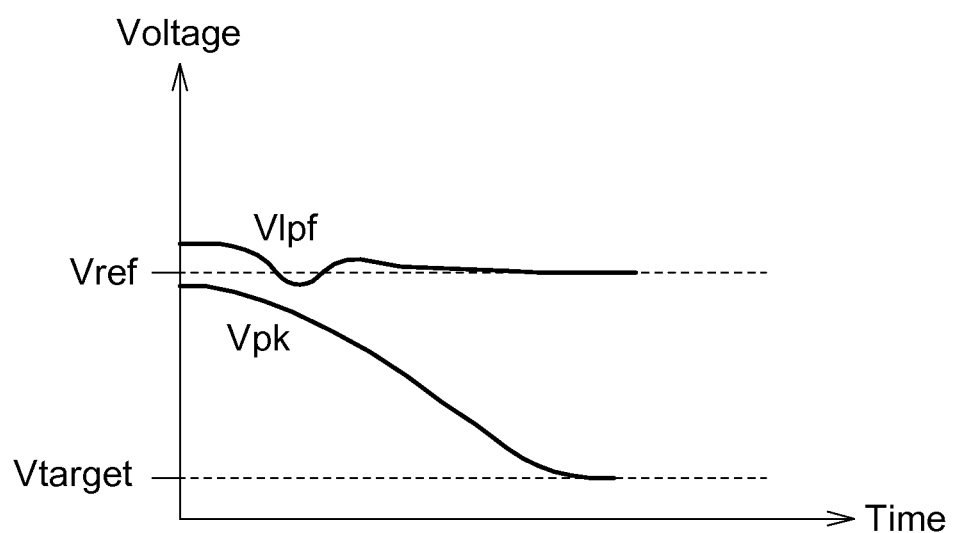
FIG. 5 is a timing diagram showing an example of the amplitude value and the average value obtained during the oscillation of the oscillator in FIG. 2.

FIG. 5 is a timing diagram showing an example of the amplitude value and the average value obtained during the oscillation of the oscillator in FIG. 2. As shown in FIG. 5, in the beginning of oscillation, the oscillation signal S1 has an amplitude Vpfk which differs with the target value Vtarget significantly, and an average value Vlpf which deviates from the reference value Vref. Before the oscillation signal S1 reaches the target value Vtarget, the oscillation controller 230 increases the current supplied to the amplifier 206. When the average value Vlpf which deviates from the reference value Vref, the oscillation controller 230 adjusts the amplitudes of the sink current Isink and the source current (source. In this way, the amplitude value Vpk can be limited to the target value Vtarget, while the average value Vlp to the reference value Vref, indicating that the oscillation signal S1 can be oscillated stably and properly.

Refer to FIG. 2 for further illustration. The oscillator 200 can further include a selection controller 240 and a configuration unit 250. The selection controller 240 is for providing the selection signal Sel which determines the strength of the variable current source 231. The configuration unit 250 stores various parameters or values for the oscillation signal S1, such as the target value Vtarget related to the amplitude of the oscillation signal S1, or the reference value Vref related to the DC level of the oscillation signal S1. The configuration unit 250 can be for example implemented by a programmable reference voltage generator, such as a band gap reference circuit. The band gap reference circuit can be obtained from various manufactures. The band gap reference circuit can generate one or more required voltages by using one or more reference voltages. However, the invention is not limited thereto. Those skilled in the art will appreciate that other embodiments for various parameters or values of the oscillator are possible and practicable.

According to the aforementioned description, it can be seen that in an environment where noise level is high, the oscillator provided by the embodiments can improve on the problem of failing to generate an oscillation signal. For example, the target value Vtarget and the reference value Vref can be determined according to using environment or power consumption. As such, the amplifier can be provided with a current which is in response to the amplitude of the oscillation signal, so that signal oscillation can have enhanced robustness against environment influence or process variation. Moreover, the swing of the oscillation signal can be centered at certain region, so that the oscillator can have enhanced noise immunity and can generate an oscillation signal with a full swing. Furthermore, the oscillation signal S1 can be amplified and output from an output amplifier 260 of the oscillator 200. The output amplifier 260 has its two input terminals coupled to the two terminals n1 and n2 of the oscillator 200, performs signal amplification, and generates a clock signal OSC_OUT. As compared with a conventional Schmitt trigger, the embodiment can improve the duty cycle variation of the oscillation signal.

According to the embodiments, the disclosed oscillator and oscillation circuit have many advantages, some of which are listed below:

by detecting and controlling the amplitude of the oscillation signal, an oscillator can have enhanced robustness against environment influence;

after completing oscillation of the oscillation signal, the oscillator can adjust current to reduce power consumption; and by detecting and controlling the DC level of the oscillation signal, the oscillator can have enhanced noise immunity and can generate an oscillation signal with a full swing.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An oscillator for adjusting the amplitude and the level of an oscillation signal, the oscillator comprising:
   two terminals each for being coupled to a capacitor;
   a crystal coupled between the two terminals;
   a feedback resistor coupled between the two terminals;
   an amplifier coupled between the two terminals;
   a peak amplitude detector coupled to one of the two terminals, the peak amplitude detector detecting the amplitude of the oscillation signal and generating an amplitude value;
   an average voltage detector coupled to one of the two terminals, the average voltage detector detecting the direct current (DC) level of the oscillation signal and generating an average value; and
   an oscillation controller configured to generate two power signals according to the amplitude value and the average value, wherein the two power signals are provided to the amplifier so that the amplifier adjusts the amplitude and DC level of the oscillation signal.

2. The oscillator according to claim 1, wherein the oscillation controller comprises:
   two power supply terminals coupled to the amplifier;
   a variable current source for providing a bias current, the amplitude of the bias current being varied with the amplitude value of the oscillation signal; and a first comparator coupling the variable current source to the two power supply terminals, the first comparator comparing the average value with a reference value, wherein when the bias current flows into the first comparator, a source current and a sink current which are related to the comparison result of the first comparator are formed and flow into the two power supply terminals.

3. The oscillator according to claim 2, wherein the oscillation controller further comprises:

a second comparator coupled to the variable current source, the second comparator comparing the amplitude value with a target value and basing its comparison result on generating a control signal which is used to control the amplitude of the bias current provided by the variable current source.

4. The oscillator according to claim 2, wherein the first comparator comprises:

a first current mirror coupled to one of the two power supply terminals;

a second current mirror coupled to the other one of the two power supply terminals;

a first transistor having a data terminal coupled to the first current mirror, another data terminal coupled to the variable current source, and a control terminal for receiving the reference value; and a second transistor having a data terminal coupled to the second current mirror, another data terminal coupled to the variable current source and the another data terminal of the first transistor, and a control terminal for receiving the average value.

5. The oscillator according to claim 1, wherein the average voltage detector is a low-pass filter.

6. The oscillator according to claim 1, wherein the oscillation controller comprises:

two power supply terminals coupled to the amplifier;

a variable current source for providing a bias current, the amplitude of the bias current being varied with the amplitude value of the oscillation signal; and a comparator coupled to the variable current source, the comparator comparing the average value with a target value and basing its comparison result on generating a control signal which is used to control the amplitude of the bias current provided by the variable current source.

7. A control circuit for use in an oscillator, the control circuit being for adjusting the amplitude and the level of an oscillation signal generated by the oscillator, the control circuit comprising:

a peak amplitude detector for detecting the amplitude of the oscillation signal and generating an amplitude value;

an average voltage detector for detecting the direct current (DC) level of the oscillation signal and generating an average value; and an oscillation controller for generating two power signals according to the amplitude value and the average value, wherein the two power signals are provided to the oscillator so that the oscillator adjusts the amplitude and DC level of the oscillation signal.

8. The control circuit according to claim 7, wherein the oscillation controller comprises:

two power supply terminals;

a variable current source for providing a bias current, the amplitude of the bias current being varied with the amplitude value of the oscillation signal; and a first comparator coupling the variable current source to the two power supply terminals, the first comparator comparing the average value with a reference value, wherein when the bias current flows into the first comparator, a source current and a sink current which are related to the comparison result of the first comparator are formed and flow into the two power supply terminals.

9. The control circuit according to claim 8, wherein the oscillation controller further comprises:

a second comparator coupled to the variable current source, the second comparator comparing the amplitude value with a target value and basing its comparison result on generating a control signal which is used to control the amplitude of the bias current provided by the variable current source.

10. The control circuit according to claim 8, wherein the first comparator comprises:

a first current mirror coupled to one of the two power supply terminals;

a second current mirror coupled to the other one of the two power supply terminals;

a first transistor having a data terminal coupled to the first current mirror, another data terminal coupled to the variable current source, and a control terminal for receiving the reference value; and a second transistor having a data terminal coupled to the second current mirror, another data terminal coupled to the variable current source and the another data terminal of the first transistor, and a control terminal for receiving the average value.

11. The control circuit according to claim 7, wherein the average voltage detector is a low-pass filter.

12. The control circuit according to claim 7, wherein the oscillation controller comprises:

two power supply terminals;

a variable current source for providing a bias current, the amplitude of the bias current being varied with the amplitude value of the oscillation signal; and a comparator coupled to the variable current source, the comparator comparing the average value with a target value and basing its comparison result on generating a control signal which is used to control the amplitude of the bias current provided by the variable current source.

* * * * *